United States Patent
Fujisaku et al.

(10) Patent No.: US 12,413,236 B2
(45) Date of Patent: Sep. 9, 2025

(54) ATOMIC OSCILLATOR, CONTROL METHOD, AND CONTROL APPARATUS

(71) Applicant: NEC Corporation, Tokyo (JP)

(72) Inventors: Takahiro Fujisaku, Tokyo (JP); Kenta Matsumoto, Tokyo (JP); Sota Kagami, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 18/409,925

(22) Filed: Jan. 11, 2024

(65) Prior Publication Data

US 2024/0259026 A1 Aug. 1, 2024

(30) Foreign Application Priority Data

Jan. 31, 2023 (JP) ................................. 2023-013282

(51) Int. Cl.
H03L 7/26 (2006.01)
H03B 17/00 (2006.01)

(52) U.S. Cl.
CPC .............. H03L 7/26 (2013.01); H03B 17/00 (2013.01)

(58) Field of Classification Search
CPC ................................. H03L 7/26; H03B 17/00
USPC ................................................... 331/94.1, 3
See application file for complete search history.

(56) References Cited

U.S. PATENT DOCUMENTS

2016/0061913 A1* 3/2016 Kobayashi ............ G01R 33/26
324/305

FOREIGN PATENT DOCUMENTS

JP 2017-011680 A 1/2017

* cited by examiner

*Primary Examiner* — Arnold M Kinkead
(74) *Attorney, Agent, or Firm* — Sughrue Mion, PLLC

(57) ABSTRACT

An atomic oscillator of the present disclosure includes: two gas cells with alkali metal atoms encapsulated in, respectively; a light generator that irradiates each of the two gas cells with an irradiation light having at least two different frequency components; a light detector that detects transmitted lights transmitted by the two gas cells, respectively; and a controller that determines resonance frequencies corresponding to the respective two gas cells based on light amounts of the transmitted lights by the respective two gas cells, and controls an oscillation frequency based on the determined resonance frequencies. Then, the two gas cells are configured to have different characteristics of the corresponding resonance frequencies with respect to temperature, and the controller is configured to control the oscillation frequency based on a result of comparison between the resonance frequencies corresponding to the respective two gas cells.

7 Claims, 8 Drawing Sheets

ATOMIC OSCILLATOR, CONTROL METHOD, AND CONTROL APPARATUS

INCORPORATION BY REFERENCE

This application is based upon and claims the benefit of priority from Japanese patent application No. 2023-013282, filed on Jan. 31, 2023, the disclosure of which is incorporated herein in its entirety by reference.

TECHNICAL FIELD

The present invention relates to an atomic oscillator, a control method, a control apparatus, and a program.

BACKGROUND ART

An atomic oscillator is an apparatus that measures accurate time based on the natural frequency of an atom. A compact atomic clock mainly measures the natural frequency of an atom using the CPT (Coherent Population Trapping), which is a quantum interference effect occurring when an alkali metal atomic gas is irradiated with excitation lights having two frequencies, as the oscillation principle of an atomic oscillator. In the CPT, when the difference between the frequencies of the two excitation lights matches the transition frequency between the ground levels of the alkali metal, the excitation light is not absorbed and the amount of transmitted light becomes larger. The atomic oscillator using the CPT as the operation principle sweeps the difference between the frequencies of the two excitation lights, and determines a resonance frequency, which is the difference between the frequencies that maximizes the amount of transmitted light, as the natural frequency of the atom. It is one of the performance indexes of the atomic oscillator whether or not the natural frequency of the atom can be stably acquired for a long term.

In the atomic oscillator described above, one factor of performance degradation is a temperature shift, which is fluctuation of the resonance frequency caused by a temperature change in the alkali metal atomic gas. That is to say, when a temperature change inside the oscillator occurs, the optical transition characteristic of the atom fluctuates, and the stability of the oscillation frequency decreases. In response to such a problem, Patent Literature 1 describes that a temperature measuring device and a heater are provided outside an alkali metal cell. Then, Patent Literature 1 describes that the temperature of the alkali metal cell is kept constant by heating the alkali metal cell with the heater using the temperature information of the cell.

Patent Literature 1: Japanese Unexamined Patent Application Publication No. JP-A 2017-011680

However, the atomic oscillator of Patent Literature 1 described above firstly causes a problem that the power consumption increases for heating the heater. Moreover, in a case where the ambient temperature of the alkali atom cell is measured by the temperature measuring device, the temperature of the atom itself is not measured, and the frequency stability cannot be increased more. Furthermore, in the atomic oscillator of Patent Literature 1, wiring for the heater and the temperature measuring device is required, and a magnetic field emitted by the wiring may affect the frequency, so that the frequency stability cannot be increased more.

SUMMARY OF THE INVENTION

Accordingly, an object of the present disclosure is to provide an atomic oscillator that can solve the abovementioned problem that it is difficult to suppress the power consumption and further increase the frequency stability.

An atomic oscillator as an aspect of the present disclosure includes: two gas cells with alkali metal atoms encapsulated in, respectively; a light generator that irradiates each of the two gas cells with an irradiation light having at least two different frequency components; a light detector that detects transmitted lights transmitted by the two gas cells, respectively; and a controller that determines resonance frequencies corresponding to the respective two gas cells based on light amounts of the transmitted lights by the respective two gas cells, and controls an oscillation frequency based on the determined resonance frequencies. The two gas cells are configured to have different characteristics of the corresponding resonance frequencies with respect to temperature. The controller controls the oscillation frequency based on a result of comparison between the resonance frequencies corresponding to the respective two gas cells.

A control method as an aspect of the present disclosure is a control method by an atomic oscillator. The atomic oscillator includes: two gas cells with alkali metal atoms encapsulated in, respectively; a light generator that irradiates each of the two gas cells with an irradiation light having at least two different frequency components; a light detector that detects transmitted lights transmitted by the two gas cells, respectively; and a control apparatus that determines resonance frequencies corresponding to the respective two gas cells based on light amounts of the transmitted lights by the respective two gas cells, and controls an oscillation frequency based on the determined resonance frequencies. The two gas cells are configured to have different characteristics of the corresponding resonance frequencies with respect to temperature. The control method includes, by the control apparatus, controlling the oscillation frequency based on a result of comparison between the resonance frequencies corresponding to the respective two gas cells.

A control apparatus as an aspect of the present disclosure is a control apparatus of an atomic oscillator. The atomic oscillator includes: two gas cells with alkali metal atoms encapsulated in, respectively; a light generator that irradiates each of the two gas cells with an irradiation light having at least two different frequency components; a light detector that detects transmitted lights transmitted by the two gas cells, respectively; and a control apparatus that determines resonance frequencies corresponding to the respective two gas cells based on light amounts of the transmitted lights by the respective two gas cells, and controls an oscillation frequency based on the determined resonance frequencies. The two gas cells are configured to have different characteristics of the corresponding resonance frequencies with respect to temperature. The control apparatus controls the oscillation frequency based on a result of comparison between the resonance frequencies corresponding to the respective two gas cells.

A program as an aspect of the present disclosure is a computer program of an atomic oscillator. The atomic oscillator includes: two gas cells with alkali metal atoms encapsulated in, respectively; a light generator that irradiates each of the two gas cells with an irradiation light having at least two different frequency components; a light detector that detects transmitted lights transmitted by the two gas cells, respectively; and a control apparatus that determines resonance frequencies corresponding to the respective two gas cells based on light amounts of the transmitted lights by the respective two gas cells, and controls an oscillation frequency based on the determined resonance frequencies. The two gas cells are configured to have different characteristics of the corresponding resonance frequencies with respect to temperature. The computer program includes instructions for causing the control apparatus to processes to control the oscillation frequency based on a result of comparison between the resonance frequencies corresponding to the respective two gas cells.

With the configuration as described above, the present disclosure can provide an atomic oscillator that can further increase the frequency stability while suppressing the power consumption.

EXAMPLE EMBODIMENT

First Example Embodiment

Figure 4:
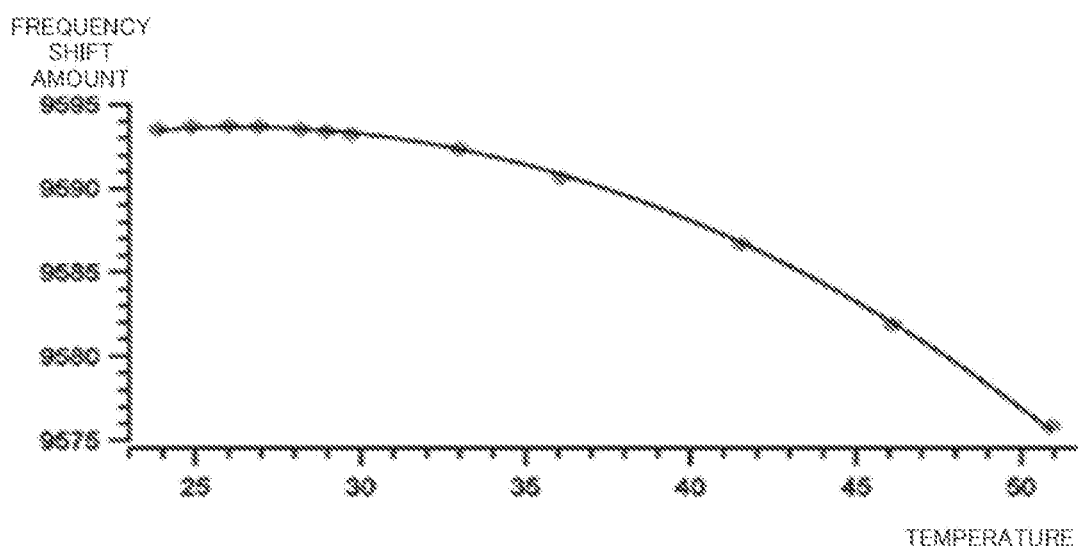
FIG. 4 is a view showing the characteristic of the atomic oscillator disclosed in FIG. 1.
Figure 4:
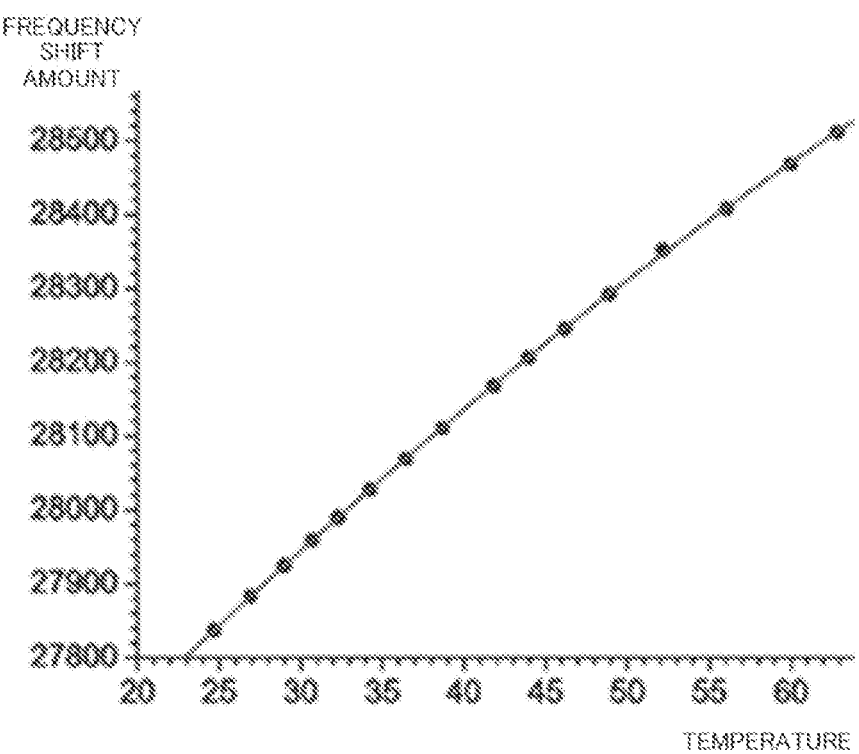
Figure 5:
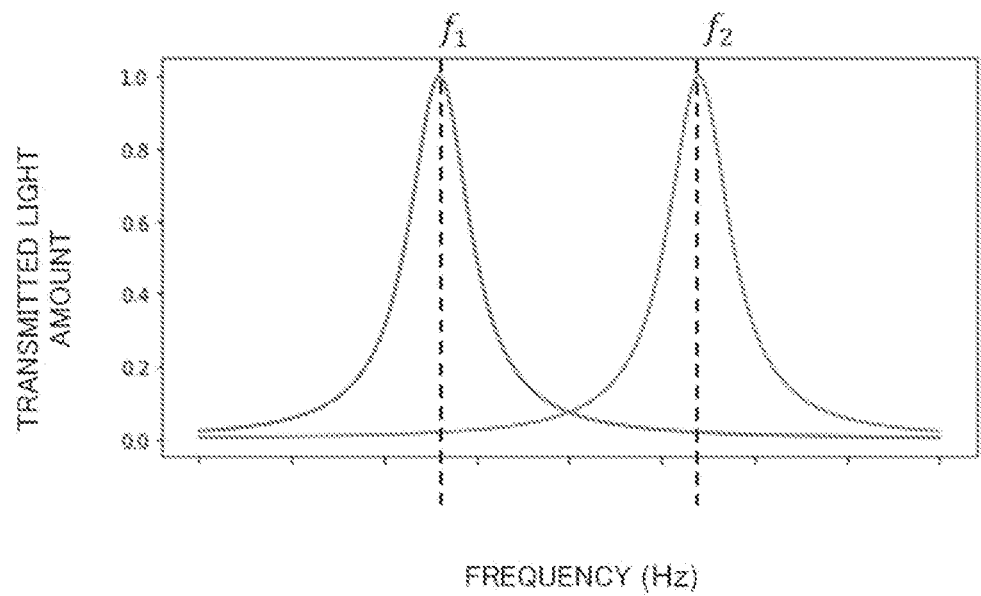
FIG. 5 is a view showing processing by the atomic oscillator disclosed in FIG. 1.
Figure 5:
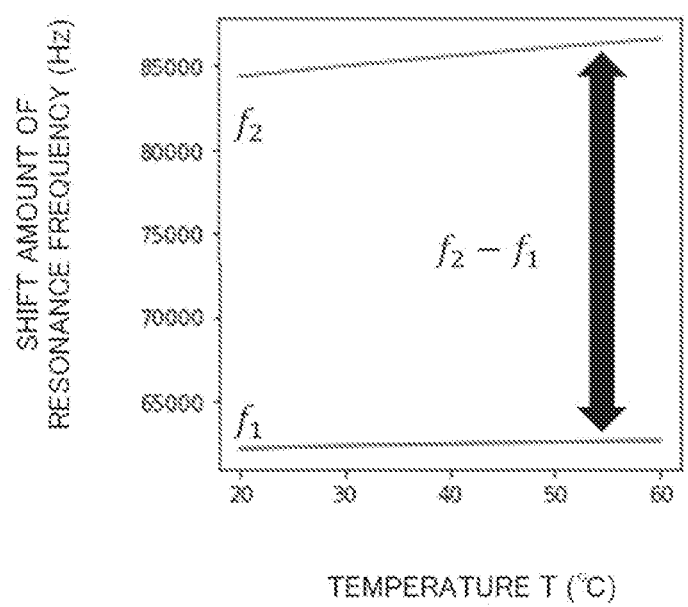
Figure 6:
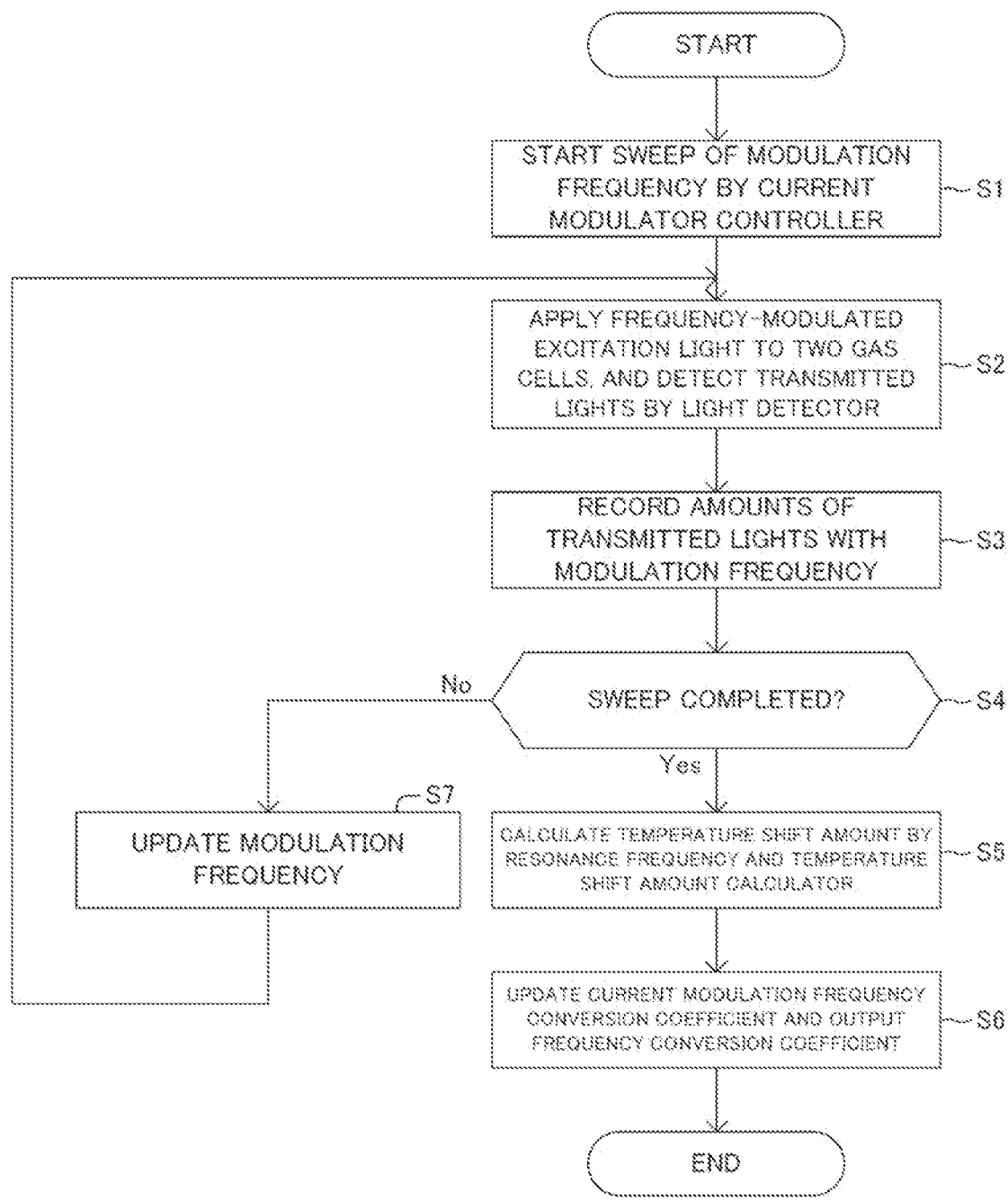
FIG. 6 is a flowchart showing the processing operation of the atomic oscillator disclosed in FIG. 1.

A first example embodiment of the present disclosure will be described with reference to FIGS. 1 to 6. FIGS. 1 to 5 are views for describing the configuration of an atomic oscillator, and FIG. 6 is a view for describing the operation of the atomic oscillator.

[Configuration]

Figure 1:
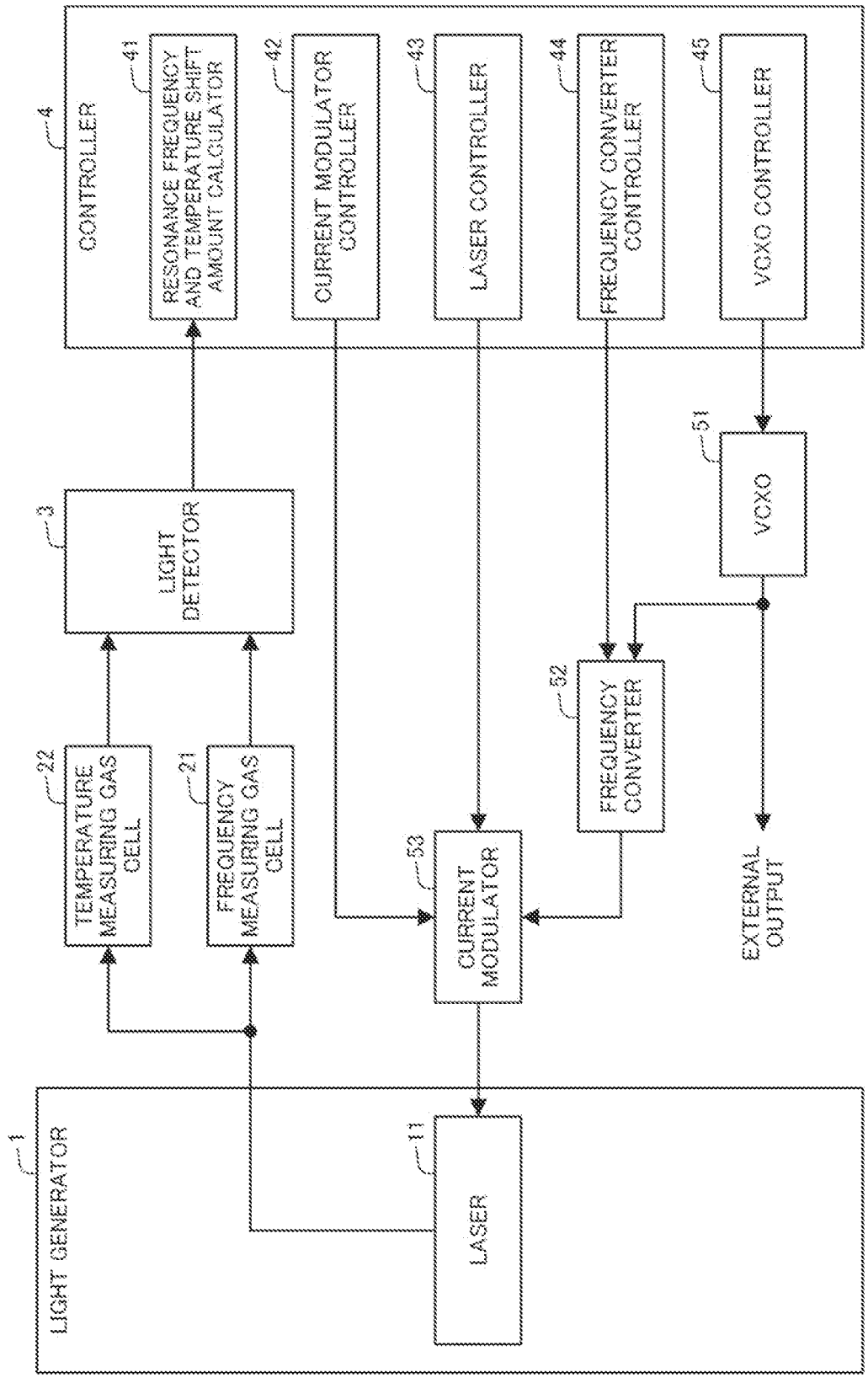
FIG. 1 is a block diagram showing the configuration of an atomic oscillator in a first example embodiment of the present disclosure.

FIG. 1 is a block diagram showing the configuration of an atomic oscillator in this example embodiment. The atomic oscillator in this example embodiment includes a light generator 1, two gas cells 21 and 22, a light detector 3, a controller 4, a VCXO (Voltage Controlled Crystal Oscillator) 51, a frequency converter 52, and a current modulator 53. The light generator 1 includes a laser 11. The controller 4 includes a resonance frequency and temperature shift amount calculator 41, a current modulator controller 42, a laser controller 43, a frequency converter controller 44, and a VCXO controller 45. The controller 4 is configured by an information processing apparatus (control apparatus) including an arithmetic logic unit and a memory unit, and the respective parts 41 to 45 of the controller 4 are realized by execution of a program by the arithmetic logic unit. The respective components will be described in detail below.

Figure 2:
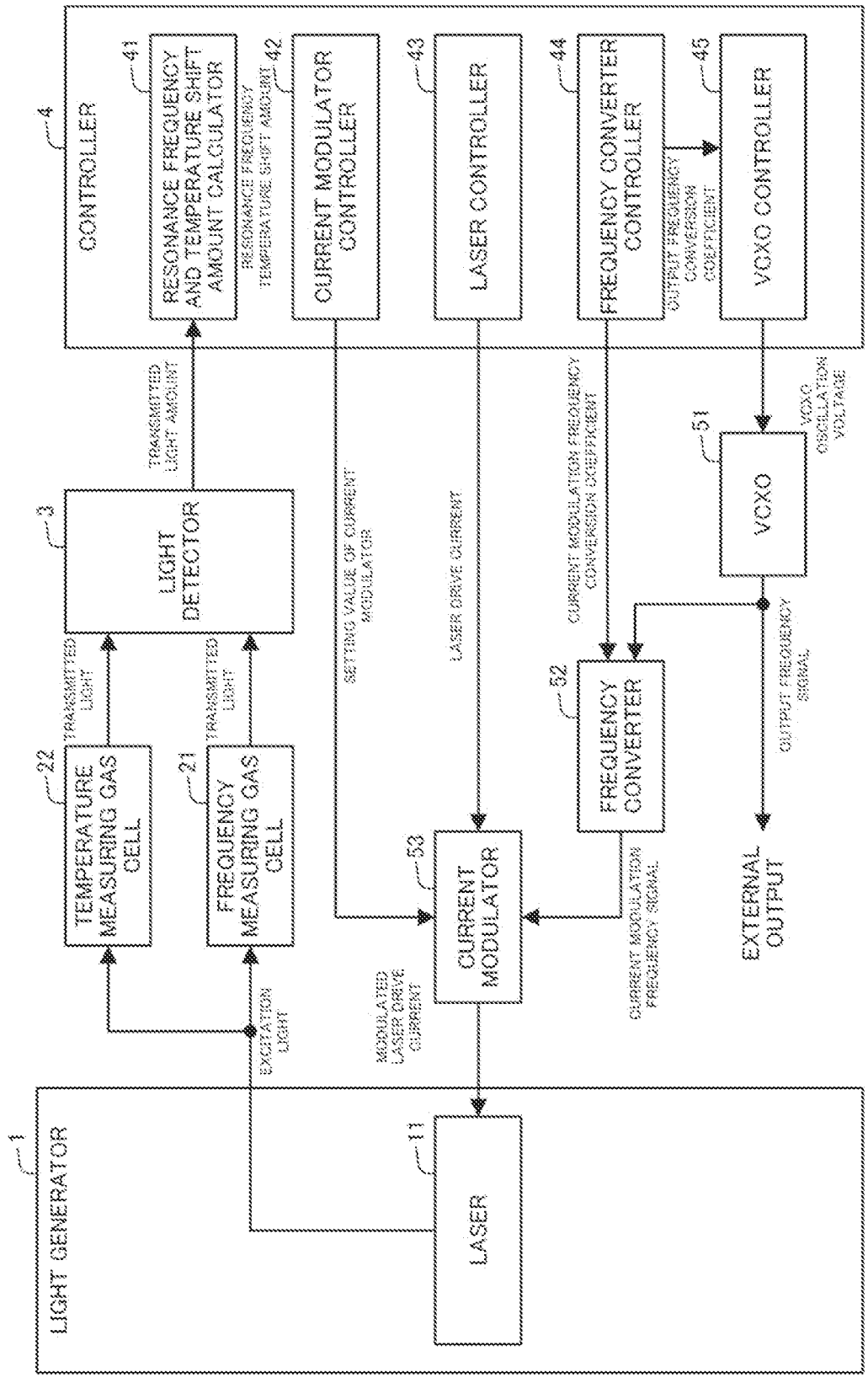
FIG. 2 is a view showing signals output from the respective components of the atomic oscillator disclosed in FIG. 1.

The light generator 1, in cooperation with the controller 4, the VCXO 51, the frequency converter 52 and the current modulator 53, generates two excitation lights (irradiation lights) including at least two different frequency components by performing frequency modulation from a single wavelength excitation light, and irradiates the two gas cells 21 and 22, respectively. FIG. 2 shows signals output from the respective components of the atomic oscillator. As shown in this figure, a current modulation frequency conversion coefficient and an output frequency conversion coefficient that are set in advance are output from the frequency converter controller 44 and, by output of a VCXO oscillation voltage based on the output frequency conversion coefficient from the VCXO controller 45, the oscillation frequency of an output frequency signal that is output from the VCXO 51 and becomes an external output is controlled. Moreover, the output frequency signal output from the VCXO 51 is subject to frequency conversion by the frequency converter 52 based on the current modulation frequency conversion coefficient and, for example, a current modulation frequency signal around 9.2 GHz corresponding to the transition frequency between the ground levels of a cesium atom is output. Then, a laser drive current output from the laser controller 43 is modulated by the current modulator 53 based on a setting value of the current modulator 53 output from the current modulator controller 42, and the laser 11 is driven by the modulated laser drive current. Consequently, two excitation lights having different frequencies are generated by the light generator 1, the difference between the frequencies of the two excitation lights is swept around 9.2 GHz by changing the setting value of the current modulator 53, and the excitation lights are applied to the two gas cells 21 and 22, respectively. Since the configuration and method for generating an excitation light by the light generator 1 of the atomic oscillator are known, a detailed description thereof will be omitted.

Herein, the values of "current modulation frequency conversion coefficient" and "output frequency conversion coefficient" described above are set in advance, respectively, and are stored in the frequency converter controller 44. However, in this example embodiment, the temperature shift amount of a resonance frequency is calculated as will be described later, and the values of "current modulation frequency conversion coefficient" and "output frequency conversion coefficient" are changed to values corresponding to the temperature shift amount. This will be discussed later.

Next, the two gas cells 21 and 22 will be described. The atomic oscillator in this example embodiment includes two gas cells with alkali metal atoms encapsulated in. Specifically, first, the atomic oscillator includes a frequency measuring gas cell 21, which is a gas cell used for measuring the natural frequency of an atom using the CPT as the oscillation principle of the atomic oscillator as described before. In addition to this, the atomic oscillator includes a temperature measuring gas cell 22 in this example embodiment.

Figure 3:
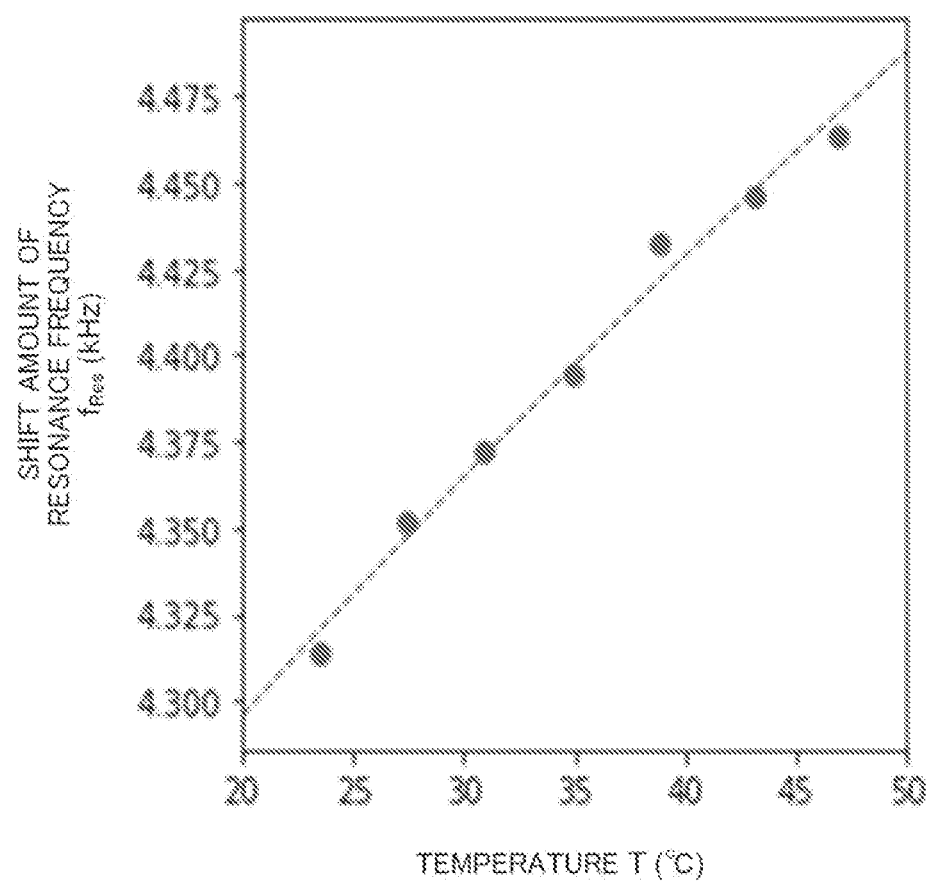
FIG. 3 is a view showing the characteristic of the atomic oscillator disclosed in FIG. 1.

Herein, the alkali metal atoms encapsulated in the two gas cells 21 and 22 may be any alkali metal atoms such as cesium atoms, rubidium atoms, sodium atoms, and potassium atoms. Meanwhile, the two gas cells 21 and 22 are configured so that characteristics of corresponding resonance frequencies with respect to temperature are different from each other. As an example, FIG. 3 shows the relation between the shift amount (fluctuation amount) of resonance frequency and temperature in a case where the alkali metal atoms are cesium atoms and the buffer gas is nitrogen, and an equation for calculating the shift amount $f_{Res}$ (Hz) of resonance frequency is shown in Equation 1.

$$f_{Res} = P(\delta T + \gamma T^2) + c \qquad \text{[Equation 1]}$$

P: gas pressure (torr)
T: temperature (° C.)
δ: 0.824 Hz/(° C.·torr) for nitrogen γ: −0.00251 Hz/(° C.$^2$·torr) for nitrogen c: constant The above δ, γ and c are values determined by the type of the buffer gas. Therefore, by differentiating the types and gas pressures of buffer gases encapsulated in the frequency measuring gas cell 21 and the temperature measuring gas cell 22, the two gas cells 21 and 22 can be configured to have different fluctuation amounts of resonance frequencies with respect to temperature change. In this example embodiment, as shown in FIG. 4, the frequency measuring gas cell 21 and the temperature measuring gas cell 22 are configured so that the types of the buffer gases encapsulated therein are different from each other. As an example, a 19 torr, Ar/N$_2$ mixed gas ($P_{Ar}/P_{N2}$=0.62) shown by reference character A1 in FIG. 4 is used for the frequency measuring gas cell 21, and a 30 torr, N$_2$ gas shown by reference character A2 in FIG. 4 is used for the temperature measuring gas cell 22. The buffer gases shown by reference characters A1 and A2 in FIG. 4 are described in the paper "Temperature and pressure shift of the Cs clock transition in the presence of buffer gases: Ne, N2, Ar, Phys. Rev. A83, 062714". Moreover, cesium is encapsulated in both the gas cells. Consequently, the fluctuation amount of resonance frequency with respect to temperature change at 25 to 50° C. in the frequency measuring gas cell 21 becomes "−0.6 Hz/° C.", the fluctuation amount of resonance frequency with respect to temperature change at 25 to 50° C. in the temperature measuring gas cell 22 becomes "20 Hz/° C.", and the temperature dependences of the respective resonance frequencies are differentiated.

The light detector 3 detects transmitted lights transmitted by the two gas cells 21 and 22 described above, and measures the amounts of the transmitted lights. At this time, since the excitation lights are applied while the setting values in frequency modulation are being changed, the light detector 3 passes the measured transmitted light amounts to the controller 4 so that the measured transmitted light amounts are recorded in association with the changed setting values, that is, the swept frequency differences. Thus, as indicated by reference character B1 in FIG. 5, the light detector 3 measures so that a graph of transmitted light amount with respect to frequency difference corresponding to the frequency measuring gas cell 21 (graph denoted by reference character f1 on the left side) and a graph of transmitted light amount with respect to frequency difference corresponding to the temperature measuring gas cell 22 (graph denoted by reference character f2 on the right side) are recorded by the controller 4.

The resonance frequency and temperature shift amount calculator 41 of the controller 4 determines resonance frequencies corresponding to the respective gas cells 21 and 22 based on the transmitted light amounts at the respective gas cells 21 and 22 passed from the light detector 3. That is to say, the resonance frequency and temperature shift amount calculator 41 determines a resonance frequency f1 corresponding to the frequency measuring gas cell 21 and a resonance frequency f2 corresponding to the temperature measuring gas cell 22. For example, the resonance frequency and temperature shift amount calculator 41 may determine difference frequencies at which the transmitted light amounts become maximum, respectively, in the respective graphs indicated reference character B1 in FIG. 5 as the resonance frequencies f1 and f2, or may determine difference frequencies at which the slopes of the transmitted light amount graphs with respect to frequency difference become zero by differentiated waveform measurement of the transmitted light amounts as the resonance frequencies.

Then, the controller 4 controls the oscillation frequency based on the determined resonance frequency f1 corresponding to the frequency measuring gas cell 21. Specifically, the controller 4 controls, in the VCXO controller 45, the oscillation frequency of an output frequency signal output by the VCXO 51 based on the resonance frequency f1 corresponding to the frequency measuring gas cell 21 (one gas cell) and an output frequency conversion coefficient (first parameter) stored in advance in the frequency converter controller 44. As an example, let us assume that an output frequency signal of 10 MHz is output by the VCXO 51 in the atomic oscillator, and that the determined resonance frequency f1 of the frequency measuring gas cell 21 is "9.192631 GHz" and a preset output frequency conversion coefficient is "(10 MHz)/(9.192631 GHz)". In this case, an output frequency signal of (9.192631 GHz)*(10 MHz)/(9.192631 GHz)=10 MHz is output by the VCXO 51. Consequently, the output frequency signal of 10 MHz is output externally from the atomic oscillator, and is also input into the frequency converter 52. Moreover, at this time, assuming that a preset current modulation frequency conversion coefficient (second parameter) is "(9.192631 GHz)/(10 MHz)", a current modulation frequency signal of (10 MHz)*(9.192631 GHz)/(10 MHz)=9.192631 GHz is generated by the frequency converter 52, that is, a reference signal to be the reference for the irradiation light is generated, and is input into the current modulator 53. The values of the output frequency conversion coefficient and the current modulation frequency conversion coefficient are preset and stored based on the oscillation frequency of the output frequency signal assumed to be output by the VCXO 51 in the atomic oscillator and the characteristics of resonance frequency shift amount and temperature of the frequency measuring gas cell 21 and the temperature measuring gas cell 22 as shown in FIG. 4.

The controller 4 in this example embodiment is further configured to control the oscillation frequency based on the results of comparison between the determined resonance frequencies f1 and f2 of the frequency measuring gas cell 21 and the temperature measuring gas cell 22 as will be described below, in order to cope with fluctuations in the resonance frequencies f1 and f2 due to temperature changes in the frequency measuring gas cell 21 and the temperature measuring gas cell 22.

The resonance frequency and temperature shift calculator 41 calculates the difference between the determined resonance frequencies f1 and f2 of the frequency measuring gas cell 21 and the temperature measuring gas cell 22, and calculates a temperature shift amount, which is the fluctuation amount of resonance frequency with respect to temperature change, based on the difference between the resonance frequencies f1 and f2. Specifically, first, the resonance frequency and temperature shift amount calculator 41 stores in advance a graph representing the relation between difference (f2−f1) in shift amounts of the resonance frequencies f1 and f2 of the frequency measuring gas cell 21 and the temperature measuring gas cell 22 and temperature T as indicated by reference character B2 in FIG. 5. The graph as indicated by reference character B2 in FIG. 5 is created and stored in advance based on the characteristics of resonance frequency shift amount and temperature of the frequency measuring gas cell 21 and the temperature measuring gas cell 22 as indicated by reference characters A1 and A2 in FIG. 4. In addition to this, the resonance frequency and temperature shift amount calculator 41 stores a graph representing the relation between temperature T and the temperature shift amount that is the fluctuation amount of each of the resonance frequencies f1 and f2 of the frequency measuring gas cell 21 and the temperature measuring gas cell 22. Specifically, the graph of the temperature shift amount to temperature T is represented by a correspondence table of temperature T and output frequency conversion coefficient and a correspondence table of temperature T and current modulation frequency conversion coefficient, and the correspondence tables are generated and stored in advance. The correspondence table between temperature T and output frequency conversion coefficient and the correspondence table between temperature T and current modulation frequency conversion coefficient are generated and stored in advance based on the oscillation frequency of an output frequency signal that is assumed to be output by the VCXO 51 in the atomic oscillator and the characteristics of resonance frequency shift amounts and temperature of the frequency measuring gas cell 21 and the temperature measuring gas cell 22 as shown in FIG. 4.

Consequently, the resonance frequency and temperature shift amount calculator 41 identifies temperature T from the difference (f1−f2) in the resonance frequencies f1 and f2 of the frequency measuring gas cell 21 and the temperature measuring gas cell 22 having been measured, based on the stored graphs and correspondence tables, and specifies an output frequency conversion coefficient and a current modulation frequency conversion coefficient from the temperature T. The resonance frequency and temperature shift amount calculator 41 performs temperature correction by changing and updating the output frequency conversion coefficient and the current modulation frequency conversion coefficient stored in the frequency converter controller 44 to the newly specified output frequency conversion coefficient and current modulation frequency conversion coefficient.

Then, the controller 4 controls the oscillation frequency based on the determined resonance frequency f1 corresponding to the frequency measuring gas cell 21 in the same manner as described above by using the output frequency conversion coefficient and current modulation frequency conversion coefficient updated by the temperature correction. Herein, as an example, assuming that the resonance frequency f1 of the frequency measuring gas cell 21 fluctuates from "9.192631 GHz" to "9.192632 GHz" due to a temperature shift, a case where temperature correction on the output frequency conversion coefficient and the current modulation frequency conversion coefficient described above is not performed, and a case where the temperature correction is performed will be described.

First, in a case where the temperature correction is not performed, the output frequency conversion coefficient remains "(10 MHz)/(9.192631 GHz)", and an output frequency signal of (9.192632 GHz)*(10 MHz)/(9.192631 GHz)=10.000011 MHz will be output by the VCXO 51 using the temperature-shifted resonance frequency (9.192632 GHz) of the frequency measuring gas cell 21. The current modulation frequency conversion coefficient remains "(9.192631 GHz)/(10 MHz)", and a current modulation frequency signal of (10.0000011 MHz)*(9.192631 GHz)/(10 MHz)=9.192632 GHz is output by the frequency converter 52. For this reason, the atomic oscillator should have performed frequency modulation of the excitation light at "9.192631 GHz" and externally output an output frequency signal of "10 MHz", but in fact, the atomic oscillator performs frequency modulation at "9.192632 GHz" and externally outputs an output frequency signal of "10.0000011 MHz".

On the other hand, in a case where the temperature correction is performed, the output frequency conversion coefficient is updated to "(10 MHz)/(9.192632 GHz)", and an output frequency signal of (9.192632 GHz)*(10 MHz)/(9.192632 GHz)=10 MHz is output by the VCXO 51 using the temperature-shifted resonance frequency (9.192632 GHz) of the frequency measuring gas cell 21. The current modulation frequency conversion coefficient is updated to "(9.192632 GHz)/(10 MHz)", and a current modulation frequency signal of (10 MHz)*(9.192632 GHz)/(10 MHz)=9.192632 GHz is output by the frequency converter 52. For this reason, the atomic oscillator performs frequency modulation of the excitation light at the resonance frequency of "9.192632 GHz" and externally outputs an output frequency signal of "10 MHz".

Instead of the correspondence table of temperature T and output frequency conversion coefficient and the correspondence table of temperature T and current modulation frequency conversion coefficient described above, the controller 4 may store a correspondence table of the difference between the resonance frequencies f1 and f2 and output frequency conversion coefficient or current modulation frequency conversion coefficient, and may store a correspondence table of the difference between the resonance frequencies f1 and f2 and fluctuation amounts of the respective resonance frequencies f1 and f2, and a formula for calculating the fluctuation amounts of the respective resonance frequencies f1 and f2 from the difference between the resonance frequencies f1 and f2. Then, the controller 4 may calculate the temperature shift amounts of the respective resonance frequencies f1 and f2 described above from the difference between the resonance frequencies based on these correspondence tables and calculation formula, and control the oscillation frequency based on the values.

[Operation]

Next, the operation of the atomic oscillator described above, particularly, the operation when correcting a temperature shift in resonance frequency will be described with reference to a flowchart of FIG. 6.

First, the controller 4 sets various setting values, and the light generator 1 generates an excitation light having at least two different frequency components. At this time, the current modulator controller 42 of the controller 4 sweeps a modulation frequency while changing around 9.2 GHz that corresponds to the transition frequency between the ground levels of a cesium atom, for example (step S1).

Then, the light generator 1 applies the generated excitation light to the two gas cells 21 and 22, respectively, and the light detector 3 detects transmitted lights (step S2). At this time, the controller 4 stores the measured amounts of the transmitted lights in association with the modulation frequency (step S3). Then, the atomic oscillator repeats the above process until the sweep of the modulation frequency and the measurement of the transmitted lights are completed (No at step S4, Step S7).

The controller 4 performs temperature correction in the following manner at any timing after the measurement of the transmitted lights at the swept modulation frequency is completed (Yes at step S4). First, the controller 4 determines the resonance frequencies f1 and f2 corresponding to the respective gas cells 21 and 22, based on the transmitted light amounts corresponding to the respective gas cells 21 and 22 passed from the light detector 3. Then, the controller 4 calculates the difference between the determined resonance frequencies f1 and f2 of the frequency measuring gas cell 21 and the temperature measuring gas cell 22, and calculates a temperature shift amount, which is the amount of fluctuation of resonance frequency to temperature change, based on the difference between the resonance frequencies f1 and f2 (step S5). For example, the controller 4 identifies temperature T based on a graph showing the relation between the difference in the shift amounts of the resonance frequency f1 of the frequency measuring gas cell 21 and the resonance frequency f2 of the temperature measuring gas cell 22 and temperature T as indicated by reference character B2 inf FIG. 5. Furthermore, the controller 4 specifies an output frequency conversion coefficient and a current modulation frequency conversion coefficient corresponding to the identified temperature T, based on a correspondence table of temperature T and output frequency conversion coefficient and a correspondence table of temperature T and current modulation frequency conversion coefficient.

Then, the controller 4 changes and updates the stored output frequency conversion coefficient and current modulation frequency conversion coefficient to the newly specified output frequency conversion coefficient and current modulation frequency conversion coefficient (step S6). After that, by controlling an oscillation frequency from the VCXO 51 using the output frequency conversion coefficient and the current modulation frequency conversion coefficient updated by the temperature correction, the atomic oscillator can appropriately cope with the temperature shift.

Thus, with the atomic oscillator of the present disclosure, it is possible to appropriately cope with a temperature shift in which a resonance frequency fluctuates due to a temperature change of an alkali metal atomic gas and increase frequency stability. Unlike in Patent Literature 1, the ambient temperature of a gas cell is not measured by an additional device and there is no need to use a heater, so that it is possible to further increase frequency stability while inhibiting increase of wiring and power consumption. That is to say, according to the present invention, by setting a parameter on t oscillation frequency based on the difference between the resonance frequencies corresponding to the two gas cells, it is possible when a temperature shift in which the resonance frequencies fluctuate due to a temperature change to control the oscillation frequency in response to the shift amount, and it is possible to increase frequency stability.

Second Example Embodiment

Figure 7:
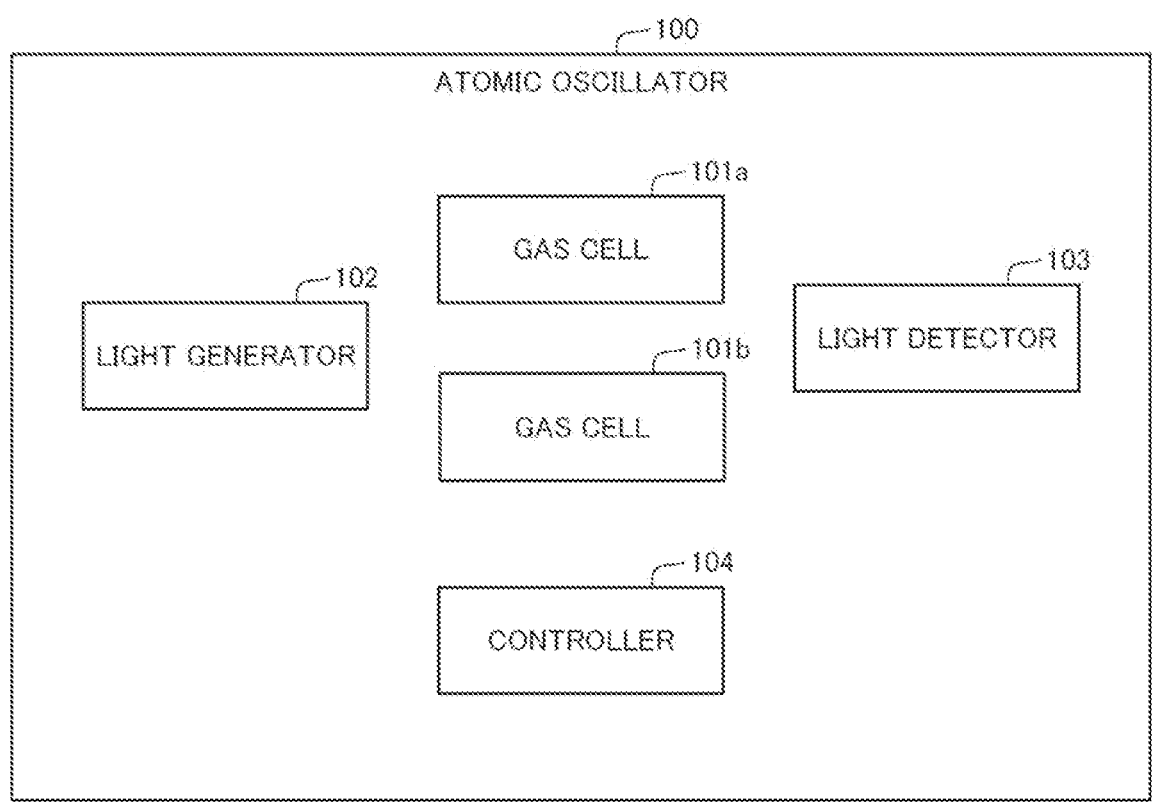
FIG. 7 is a block diagram showing the configuration of an atomic oscillator in a second example embodiment of the present disclosure.
Figure 8:
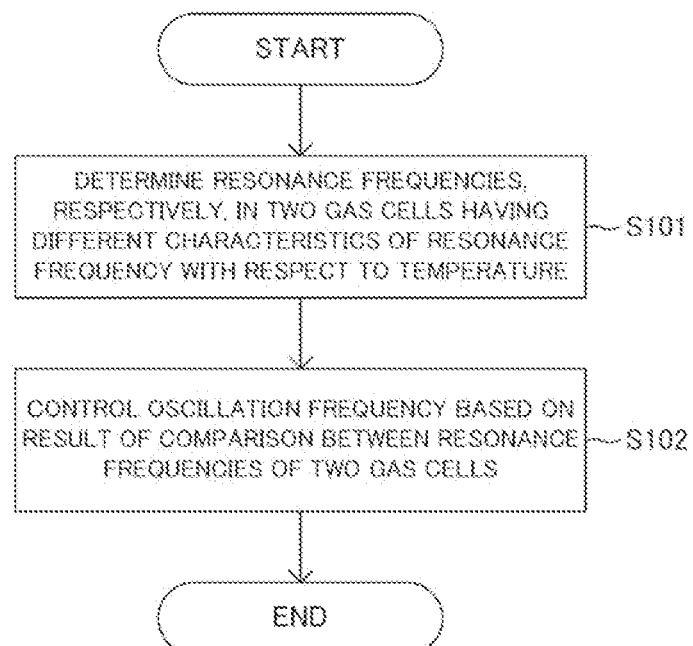
FIG. 8 is a flowchart showing the operation of the atomic oscillator in the second example embodiment of the present disclosure.

Next, a second example embodiment of the present invention will be described with reference to FIGS. 7 and 8. FIG. 7 is a block diagram showing the configuration of an atomic oscillator in the second example embodiment, and FIG. 8 is a flowchart showing the operation of the atomic oscillator. In this example embodiment, the overview of the configurations of the atomic oscillator and the control method described in the example embodiment described above.

As shown in FIG. 7, an atomic oscillator 100 in this example embodiment includes: two gas cells 101a and 101b in which alkali metal atoms are encapsulated, respectively; a light generator 102 that irradiates each of the two gas cells with an irradiation light having at least two different frequency components; a light detector 103 that detects transmitted lights transmitted by the two gas cells, respectively; and a controller 104 that determines resonance frequencies corresponding to the respective two gas cells based on the light amounts of the transmitted lights by the respective two gas cells and controls an oscillation frequency based on the determined resonance frequencies. Then, the two gas cells 101a and 101b are configured so that characteristics of the corresponding resonance frequencies with respect to temperature are different from each other, and moreover, the controller 104 is configured to control the oscillation frequency based on the result of comparison between the resonance frequencies corresponding to the respective two gas cells.

Then, the controller 104 (control device) with the above configuration executes processes to: determine resonance frequencies in the two gas cells 101a and 101b having different characteristics of resonance frequency with respect to temperature, respectively (step S101); and control the oscillation frequency based on the result of comparison between the resonance frequencies corresponding to the respective two gas cells (step S102) as shown in FIG. 8. The processes by the controller 104 are realized by execution of a program by an arithmetic logic unit configuring the controller 104.

Thus, in the atomic oscillator of the present disclosure, the oscillation frequency is controlled based on the result of comparison between the resonance frequencies of two gas cells having different characteristics of resonance frequency with respect to temperature. Consequently, it is possible to further increase frequency stability while inhibiting increase of components and power consumption in the atomic oscillator.

Although the present invention has been described above with reference to the example embodiments and the like disclosed above, the present invention is not limited to the example embodiments described above. The configurations and details of the present invention can be changed in various manners that can be understood by one skilled in the art within the scope of the present invention.

SUPPLEMENTARY NOTES

The whole or part of the example embodiments disclosed above can be described as the following supplementary notes. Below, the overview of the configurations of the atomic oscillator, the control method, the control apparatus, and the program according to the present invention will be described. Meanwhile, the present invention is not limited to the following configurations.

Supplementary Note 1

An atomic oscillator comprising:
two gas cells with alkali metal atoms encapsulated in, respectively;
a light generator that irradiates each of the two gas cells with an irradiation light having at least two different frequency components;
a light detector that detects transmitted lights transmitted by the two gas cells, respectively; and
a controller that determines resonance frequencies corresponding to the respective two gas cells based on light amounts of the transmitted lights by the respective two gas cells, and controls an oscillation frequency based on the determined resonance frequencies, wherein:
the two gas cells are configured to have different characteristics of the corresponding resonance frequencies with respect to temperature; and
the controller controls the oscillation frequency based on a result of comparison between the resonance frequencies corresponding to the respective two gas cells.

Supplementary Note 2

The atomic oscillator according to Supplementary Note 1, wherein the controller controls the oscillation frequency based on a difference between the resonance frequencies corresponding to the respective two gas cells.

Supplementary Note 3

The atomic oscillator according to Supplementary Note 2, wherein
the controller calculates, based on the difference between the resonance frequencies corresponding to the respective two gas cells, fluctuation amounts of the resonance frequencies with respect to temperature change of the alkali metal atoms encapsulated in the gas cells, and controls the oscillation frequency based on the calculated fluctuation amounts.

Supplementary Note 4

The atomic oscillator according to Supplementary Note 2 or 3, wherein
the controller controls the oscillation frequency based on the resonance frequency corresponding to one of the gas cells and a preset first parameter, and also changes the first parameter based on the difference between the resonance frequencies corresponding to the respective two gas cells to control the oscillation frequency based on the changed first parameter and the resonance frequency corresponding to the one gas cell.

Supplementary Note 5

The atomic oscillator according to Supplementary Note 4, wherein
the controller controls so as to generate a reference signal to be a reference for the irradiation light based on the oscillation frequency and a preset second parameter, and also changes the second parameter based on the difference between the resonance frequencies corresponding to the respective two gas cells to control so as to generate the reference signal based on the changed second parameter and the oscillation frequency.

Supplementary Note 6

The atomic oscillator according to any of Supplementary Notes 1 to 5, wherein
the two gas cells are configured to have different fluctuation amounts of the resonance frequencies with respect to temperature change.

Supplementary Note 7

The atomic oscillator according to any of Supplementary Notes 1 to 6, wherein
the two gas cells are configured with buffer gases of different types or pressures encapsulated in, respectively.

Supplementary Note 8

A control method by an atomic oscillator, the atomic oscillator comprising:
two gas cells with alkali metal atoms encapsulated in, respectively;
a light generator that irradiates each of the two gas cells with an irradiation light having at least two different frequency components;
a light detector that detects transmitted lights transmitted by the two gas cells, respectively; and
a control apparatus that determines resonance frequencies corresponding to the respective two gas cells based on light amounts of the transmitted lights by the respective two gas cells, and controls an oscillation frequency based on the determined resonance frequencies,
the two gas cells being configured to have different characteristics of the corresponding resonance frequencies with respect to temperature,
wherein the control method comprises, by the control apparatus, controlling the oscillation frequency based on a result of comparison between the resonance frequencies corresponding to the respective two gas cells.

Supplementary Note 9

9. A control apparatus of an atomic oscillator, the atomic oscillator comprising:
two gas cells with alkali metal atoms encapsulated in, respectively;
a light generator that irradiates each of the two gas cells with an irradiation light having at least two different frequency components;
a light detector that detects transmitted lights transmitted by the two gas cells, respectively; and
the control apparatus that determines resonance frequencies corresponding to the respective two gas cells based on light amounts of the transmitted lights by the respective two gas cells, and controls an oscillation frequency based on the determined resonance frequencies,
the two gas cells being configured to have different characteristics of the corresponding resonance frequencies with respect to temperature,
wherein the control apparatus controls the oscillation frequency based on a result of comparison between the resonance frequencies corresponding to the respective two gas cells.

Supplementary Note 10

A computer program of an atomic oscillator, the atomic oscillator comprising:
two gas cells with alkali metal atoms encapsulated in, respectively;
a light generator that irradiates each of the two gas cells with an irradiation light having at least two different frequency components;
a light detector that detects transmitted lights transmitted by the two gas cells, respectively; and
a control apparatus that determines resonance frequencies corresponding to the respective two gas cells based on light amounts of the transmitted lights by the respective two gas cells, and controls an oscillation frequency based on the determined resonance frequencies,
the two gas cells being configured to have different characteristics of the corresponding resonance frequencies with respect to temperature,
wherein the computer program comprises instructions for causing the control apparatus to execute processes to control the oscillation frequency based on a result of comparison between the resonance frequencies corresponding to the respective two gas cells.

DESCRIPTION OF REFERENCE NUMERALS 1 light generator
11 laser 21 frequency measuring gas cell
22 temperature measuring gas cell
3 light detector
4 controller
41 resonance frequency and temperature shift amount calculator
42 current modulator controller
43 laser controller
44 frequency converter controller

The invention claimed is:

1. An atomic oscillator comprising:
two gas cells with alkali metal atoms encapsulated in, respectively;
a light generator that irradiates each of the two gas cells with an irradiation light having at least two different frequency components;
a light detector that detects transmitted lights transmitted by the two gas cells, respectively; and
a controller that determines resonance frequencies corresponding to the respective two gas cells based on light amounts of the transmitted lights by the respective two gas cells, and controls an oscillation frequency based on the determined resonance frequencies, wherein:
the two gas cells are configured to have different characteristics of the corresponding resonance frequencies with respect to temperature,
the controller controls the oscillation frequency based on a result of comparison between the resonance frequencies corresponding to the respective two gas cells,
the controller controls the oscillation frequency based on a difference between the resonance frequencies corresponding to the respective two gas cells, and
the controller controls the oscillation frequency based on the resonance frequency corresponding to one of the gas cells and a preset first parameter, and also changes the first parameter based on the difference between the resonance frequencies corresponding to the respective two gas cells to control the oscillation frequency based on the changed first parameter and the resonance frequency corresponding to the one gas cell.

2. The atomic oscillator according to claim 1, wherein the controller calculates, based on the difference between the resonance frequencies corresponding to the respective two gas cells, fluctuation amounts of the resonance frequencies with respect to temperature change of the alkali metal atoms encapsulated in the gas cells, and controls the oscillation frequency based on the calculated fluctuation amounts.

3. The atomic oscillator according to claim 1, wherein the controller controls so as to generate a reference signal to be a reference for the irradiation light based on the oscillation frequency and a preset second parameter, and also changes the second parameter based on the difference between the resonance frequencies corresponding to the respective two gas cells to control so as to generate the reference signal based on the changed second parameter and the oscillation frequency.

4. The atomic oscillator according to claim 1, wherein the two gas cells are configured to have different fluctuation amounts of the resonance frequencies with respect to temperature change.

5. The atomic oscillator according to claim 1, wherein the two gas cells are configured with encapsulated buffer gases of different types or pressures.

6. A control method by an atomic oscillator, the atomic oscillator comprising:
two gas cells with alkali metal atoms encapsulated in, respectively;
a light generator that irradiates each of the two gas cells with an irradiation light having at least two different frequency components;
a light detector that detects transmitted lights transmitted by the two gas cells, respectively; and
a control apparatus that determines resonance frequencies corresponding to the respective two gas cells based on light amounts of the transmitted lights by the respective two gas cells, and controls an oscillation frequency based on the determined resonance frequencies,
the two gas cells being configured to have different characteristics of the corresponding resonance frequencies with respect to temperature,
wherein the control method comprises, by the control apparatus, controlling the oscillation frequency based on a result of comparison between the resonance frequencies corresponding to the respective two gas cells,
controlling the oscillation frequency based on a difference between the resonance frequencies corresponding to the respective two gas cells, and
controlling the oscillation frequency based on the resonance frequency corresponding to one of the gas cells and a preset first parameter, and also changing the first parameter based on the difference between the resonance frequencies corresponding to the respective two gas cells to control the oscillation frequency based on the changed first parameter and the resonance frequency corresponding to the one gas cell.

7. A control apparatus of an atomic oscillator, the atomic oscillator comprising:
two gas cells with alkali metal atoms encapsulated in, respectively;
a light generator that irradiates each of the two gas cells with an irradiation light having at least two different frequency components;
a light detector that detects transmitted lights transmitted by the two gas cells, respectively; and
a control apparatus that determines resonance frequencies corresponding to the respective two gas cells based on light amounts of the transmitted lights by the respective two gas cells, and controls an oscillation frequency based on the determined resonance frequencies,
the two gas cells being configured to have different characteristics of the corresponding resonance frequencies with respect to temperature,
wherein the control apparatus controls the oscillation frequency based on a result of comparison between the resonance frequencies corresponding to the respective two gas cells,
the control apparatus controls the oscillation frequency based on a difference between the resonance frequencies corresponding to the respective two gas cells, and
the control apparatus controls the oscillation frequency based on the resonance frequency corresponding to one of the gas cells and a preset first parameter, and also changes the first parameter based on the difference between the resonance frequencies corresponding to the respective two gas cells to control the oscillation frequency based on the changed first parameter and the resonance frequency corresponding to the one gas cell.

* * * * *